US012646952B2

(12) United States Patent
Shih et al.

(10) Patent No.: US 12,646,952 B2
(45) Date of Patent: Jun. 2, 2026

(54) CHARGING SYSTEM FOR MOBILE DEVICE WITH MULTIPLE BATTERIES

(71) Applicant: ASUSTEK COMPUTER INC., Taipei (TW)

(72) Inventors: Chia-Jui Shih, Taipei (TW); Jyun-Hao Jheng, Taipei (TW); Jyun-Wei Wang, Taipei (TW); Han-Sheng Chen, Taipei (TW); Yii-Lin Wu, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 659 days.

(21) Appl. No.: 18/184,230

(22) Filed: Mar. 15, 2023

(65) Prior Publication Data

US 2024/0195188 A1     Jun. 13, 2024

(30) Foreign Application Priority Data

Dec. 9, 2022    (TW) ................................. 111147328

(51) Int. Cl.
| | |
|---|---|
| *H01M 10/46* | (2006.01) |
| *G06F 1/16* | (2006.01) |
| *H02J 7/50* | (2026.01) |
| *H02J 7/60* | (2026.01) |
| *H05K 1/189* | (2026.01) |

(52) U.S. Cl.
CPC .............. *H02J 7/50* (2026.01); *G06F 1/1635* (2013.01); *H02J 7/60* (2026.01); *H05K 1/189* (2013.01)

(58) Field of Classification Search
CPC ....... H02J 7/0013; H02J 7/0029; H02J 7/0042

USPC .................................. 320/107, 116, 121, 140
See application file for complete search history.

(56) References Cited

U.S. PATENT DOCUMENTS

| | | | | |
|---|---|---|---|---|
| 2020/0287400 A1* | 9/2020 | Tao | ........................ | H02J 7/0018 |
| 2021/0218116 A1 | 7/2021 | Erhart | | |
| 2021/0249872 A1* | 8/2021 | Fritz | ........................ | H02M 3/04 |

FOREIGN PATENT DOCUMENTS

| | | |
|---|---|---|
| CN | 200976384 Y | 11/2007 |
| CN | 111864838 A | 10/2020 |
| CN | 113078696 A | 7/2021 |
| CN | 111009933 B | 1/2022 |

(Continued)

*Primary Examiner* — Edward Tso

(74) *Attorney, Agent, or Firm* — MUNCY, GEISSLER, OLDS & LOWE, P.C.

(57) ABSTRACT

A charging system for a mobile device including a charging connector, a first charging component, a second charging component, a flexible printed circuit board, a first battery, and a second battery is provided. The first charging component includes a first input terminal electrically connected to the charging connector and a first output terminal. The second charging component includes a second input terminal electrically connected to the first output terminal and a second output terminal. The flexible printed circuit board includes a first charging connecting terminal and a second charging connecting terminal. The first charging connecting terminal is electrically connected to the second output terminal, and the second charging connecting terminal is electrically connected to a ground terminal. The flexible printed circuit board electrically connects the first battery and the second battery in series between the first charging connecting terminal and the second charging connecting terminal.

12 Claims, 5 Drawing Sheets

(56)                    References Cited

FOREIGN PATENT DOCUMENTS

| | | | | |
|---|---|---|---|---|
| EP | 3846305 | A1 * | 7/2021 | .............. H02J 7/342 |
| WO | WO-2023143084 | A1 * | 8/2023 | ............ H01M 10/48 |

* cited by examiner

CHARGING SYSTEM FOR MOBILE DEVICE WITH MULTIPLE BATTERIES

CROSS-REFERENCE TO RELATED APPLICATION

This application claims the priority benefit of Taiwan Application Serial No. 111147328, filed on Dec. 9, 2022. The entirety of the above-mentioned patent application is hereby incorporated by reference herein and made a part of the specification.

BACKGROUND OF THE INVENTION

Field of the Invention

The disclosure relates to a mobile device, in particular to a charging system for a mobile device.

Description of the Related Art

Cell phone batteries have higher capacities to meet the needs of users as the time move forward. The easiest way to increase the battery capacity is to increase the quantity of batteries.

Currently, there are two main methods for multi-battery charging. The first is to charge the batteries in parallel. In this method, as the charging current is split to charge the batteries, the charging current is usually high. Therefore, copper foils usually need to be arranged in a large area of the charging circuit board to reduce impedance, and this limits the space on the circuit board, which is not conducive to product miniaturization.

The other method is to charge the batteries in series. This method avoids the problem caused by the current splitting as described above, and is widely used in handheld electronic devices.

FIG. 1A and FIG. 1B are block diagrams of a conventional charging system 100 for a mobile device. The charging system 100 uses a series charging architecture, in which two charging chips C1, C2 are used to charge two batteries B1, B2. FIG. 1A shows a charging path of charging the two batteries B1, B2 by the charging chip C1, and FIG. 1B shows a charging path of charging the two batteries B1, B2 by the charging chip C2.

As shown in the figures, the charging system 100 has a charging connector CON0 to obtain power. The charging system 100 uses a flexible printed circuit (FPC) board 120 to connect the two batteries B1, B2 in series for charging. The charging current generated by the charging chip C1 flows into the battery B1 through a battery connector 122, and then flows from a negative terminal of the battery B1 to a positive terminal of the battery B2 through the flexible printed circuit board 120. The charging current generated by the charging chip C2 flows through a battery connector 124 to the flexible printed circuit board 120 at the battery B2, and then flows through the flexible printed circuit board 120 to the battery B1 for series charging. The current flowing from a negative terminal of the battery B2 returns to a ground terminal G.

According to the series charging architecture in the figure, the flexible printed circuit board 120 between the battery B1 and the battery B2 needs to use two or more high-current copper foils (one of which is used to transmit the charging current generated by the charging chip C1 and the other is used to transmit the charging current generated by the charging chip C2). Limited by the space of the flexible printed circuit board 120, these high-current copper foils usually need to be stacked, which affects the heat dissipation effect and makes it difficult to dissipate heat generated in the charging process.

BRIEF SUMMARY OF THE INVENTION

The disclosure provides a charging system for a mobile device. The charging system for a mobile device includes a charging connector, a first charging component, a second charging component, a flexible printed circuit board, a first battery and a second battery. The first charging component includes a first input terminal and a first output terminal, and the first input terminal is electrically connected to the charging connector. The second charging component includes a second input terminal and a second output terminal, and the second input terminal is electrically connected to the first output terminal. The flexible printed circuit board includes a first charging connecting terminal and a second charging connecting terminal, the first charging connecting terminal is electrically connected to the second output terminal, and the second charging connecting terminal is electrically connected to a ground terminal. The first battery is electrically connected to the flexible printed circuit board, and the second battery is electrically connected to the flexible printed circuit board. The flexible printed circuit board electrically connects the first battery and the second battery in series between the first charging connecting terminal and the second charging connecting terminal.

According to the charging system for a mobile device provided in the disclosure, there is only one charging current transmission path between the batteries, thereby avoiding the heat dissipation problem of a conventional charging system for a mobile device caused by a plurality of high-current copper foils stacked on a flexible printed circuit board for transmission of the charging current.

DETAILED DESCRIPTION OF THE EMBODIMENTS

More detailed descriptions of specific embodiments of the disclosure are provided below with reference to the schematic diagrams. The features and advantages of the disclosure are described more clearly according to the following description and claims. It should be noted that all of the drawings use very simplified forms and imprecise proportions, only being used for assisting in conveniently and clearly explaining the objective of the embodiments of the disclosure.

Figure 1A:
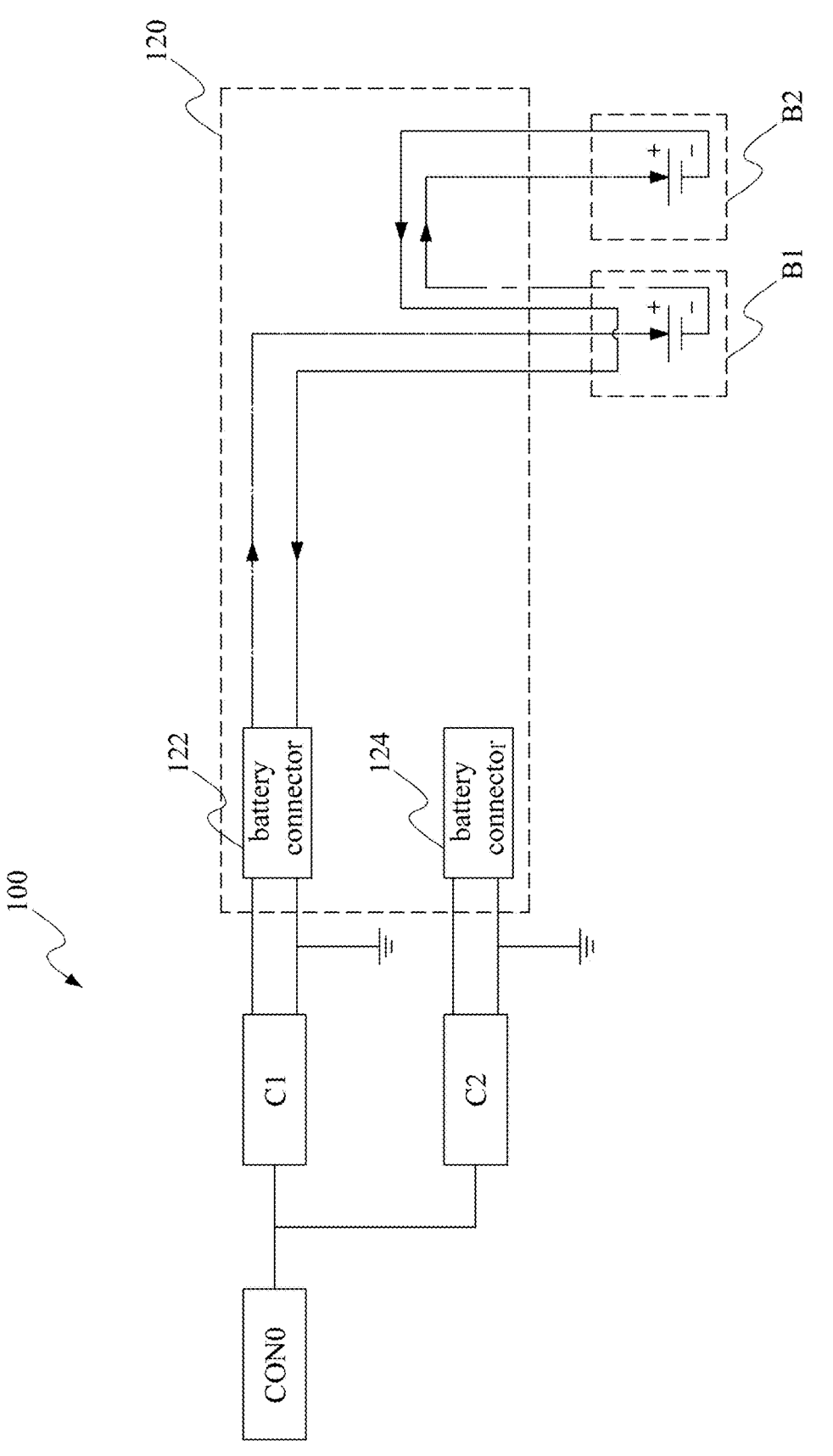
FIG. 1A and FIG. 1B are schematic block diagrams of a conventional charging system for a mobile device.
Figure 1B:
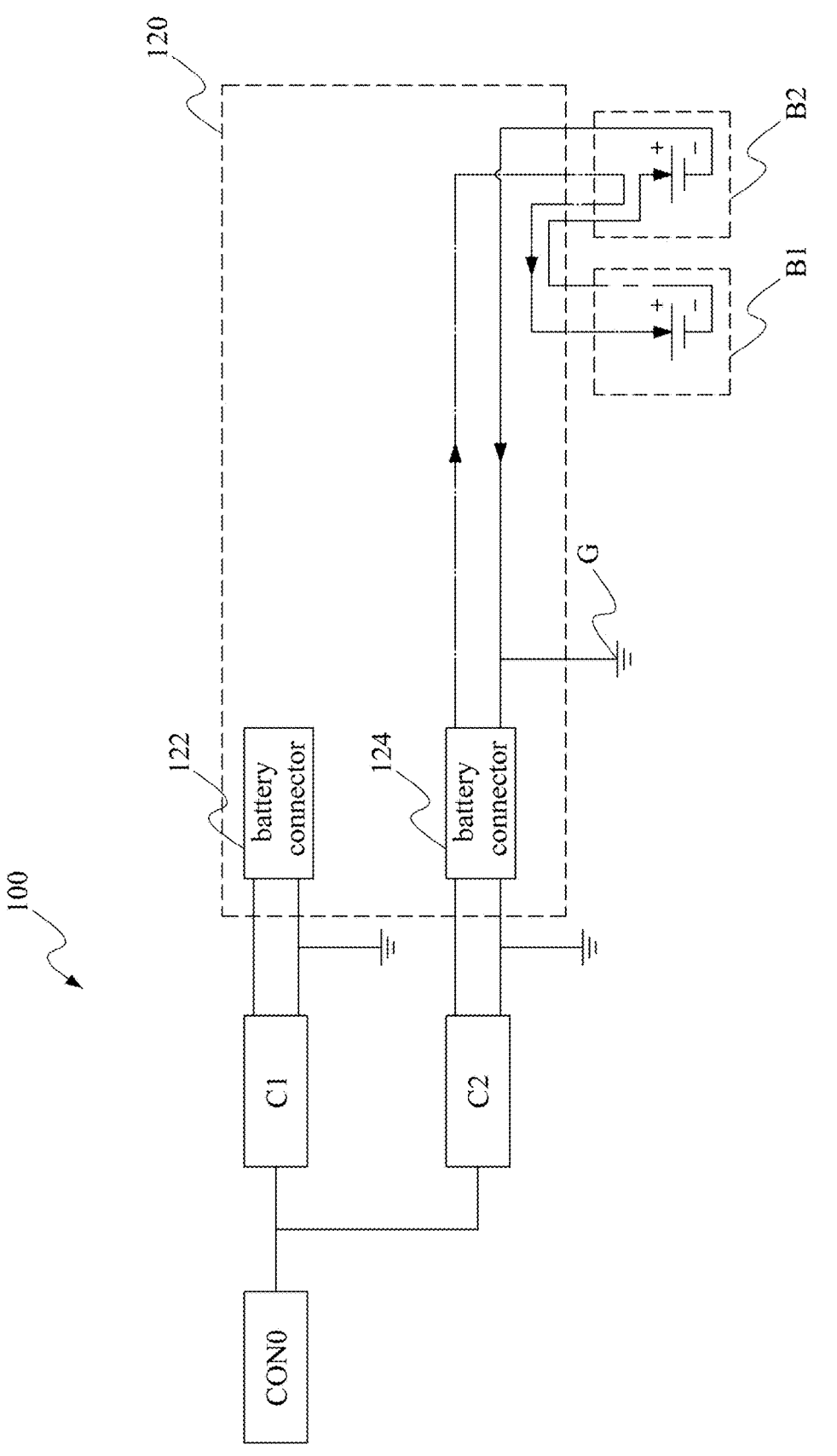
Figure 2:
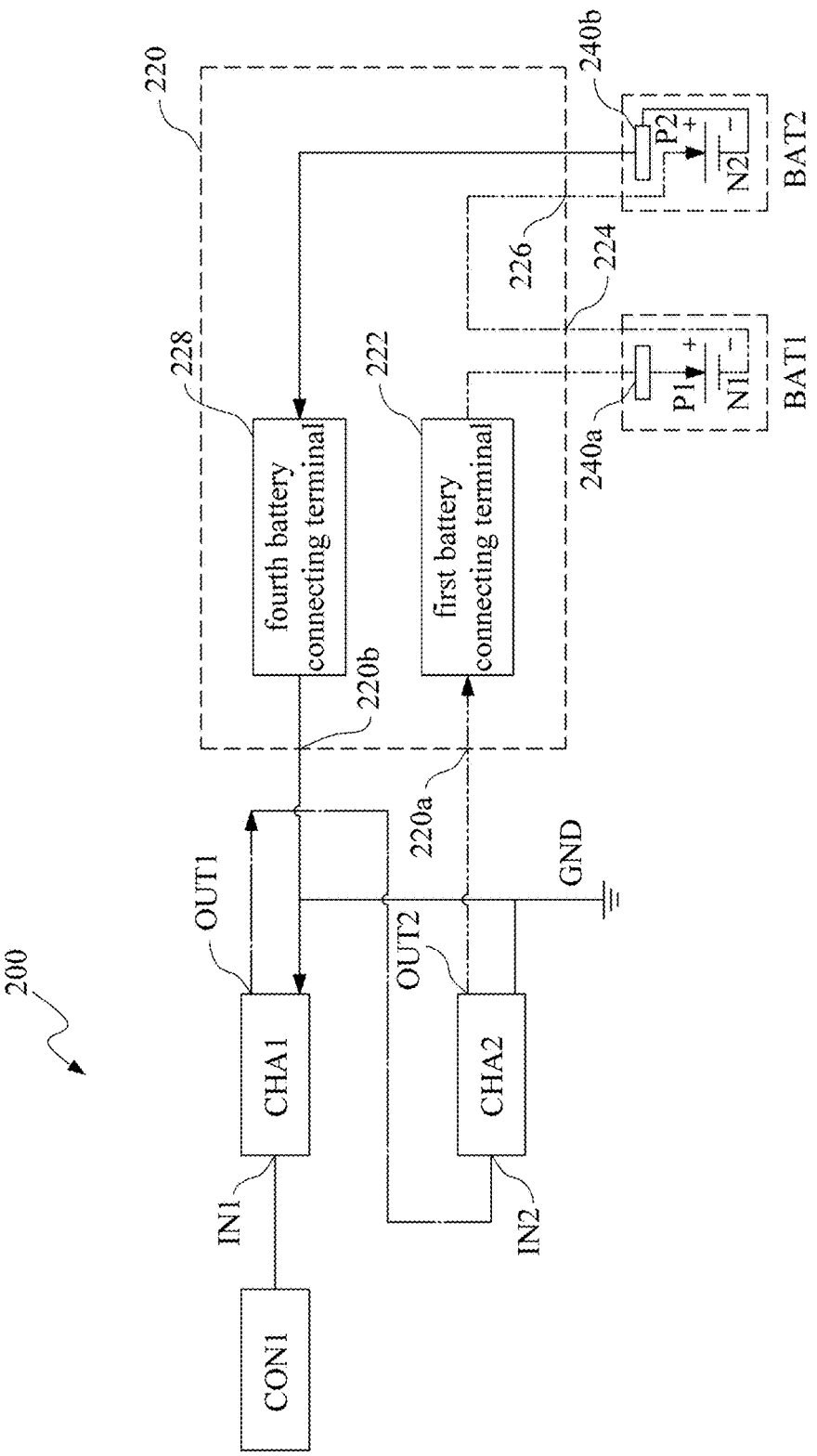
FIG. 2 is a schematic block diagram of an embodiment of a charging system for a mobile device according to the disclosure.

FIG. 2 is a schematic block diagram of an embodiment of a charging system for a mobile device according to the disclosure. In an embodiment, the mobile device is a notebook computer, a tablet computer, or a smartphone.

A charging system 200 for the mobile device includes a charging connector CON1, a first charging component CHA1, a second charging component CHA2, a first battery BAT1, a second battery BAT2, and a flexible printed circuit board 220.

The charging connector CON1 is used to connect an adapter. In an embodiment, the charging connector CON1 is a Universal Serial Bus (USB) type-C connector.

The first charging component CHA1 includes a first input terminal IN1 and a first output terminal OUT1, and the first input terminal IN1 is electrically connected to the charging connector CON1. The second charging component CHA2 includes a second input terminal IN2 and a second output terminal OUT2, and the second input terminal IN2 is electrically connected to the first output terminal OUT1. In an embodiment, the first charging component CHA1 and the second charging component CHA2 are two separate charging chips. In an embodiment, the first charging component CHA1 is different from the second charging component CHA2. In an embodiment, the first charging component CHA1 may be a buck converter. In an embodiment, the first charging component CHA1 corresponds to a positive terminal of a charging chip and the second charging component CHA2 corresponds to a negative terminal of the charging chip; or the first charging component CHA1 corresponds to a negative terminal of a charging chip and the second charging component CHA2 corresponds to a positive terminal of the charging chip.

The flexible printed circuit board 220 includes a first charging connecting terminal 220a and a second charging connecting terminal 220b. The first charging connecting terminal 220a is electrically connected to the second output terminal OUT2, and the second charging connecting terminal 220b is electrically connected to a ground terminal GND. The first battery BAT1 and the second battery BAT2 are electrically connected to the flexible printed circuit board 220. The flexible printed circuit board 220 electrically connects the first battery BAT1 and the second battery BAT2 in series between the first charging connecting terminal 220a and the second charging connecting terminal 220b to achieve charging in series.

Specifically, as shown in the figures, the flexible printed circuit board 220 includes a first battery connecting terminal 222, a second battery connecting terminal 224, a third battery connecting terminal 226 and a fourth battery connecting terminal 228.

The first battery BAT1 includes a first positive electrode P1 and a first negative electrode N1, and the second battery BAT2 includes a second positive electrode P2 and a second negative electrode N2. In an embodiment, the first battery BAT1 and the second battery BAT2 have same specifications (the same voltage and same capacity, or the like). However, the disclosure is not limited thereto. In other embodiments, the first battery BAT1 and the second battery BAT2 are alternatively batteries with different voltages or capacities.

The first battery connecting terminal 222 and the second battery connecting terminal 224 are electrically connected to the first positive electrode P1 and the first negative electrode N1, respectively. The third battery connecting terminal 226 and the fourth battery connecting terminal 228 are electrically connected to the second positive electrode P2 and the second negative electrode N2, respectively. The first battery connection 222 is electrically connected to the first charging connecting terminal 220a. The second battery connecting terminal 224 is electrically connected to the third battery connecting terminal 226. The fourth battery connecting terminal 228 is electrically connected to the second charging connecting terminal 220b. Wires for electrically connecting the connecting terminals to each other are formed on the flexible printed circuit board 220.

The first battery BAT1 further includes a first charging protection unit 240a disposed at the first positive electrode P1, and the second battery BAT2 further includes a second charging protection unit 240b disposed at the second negative electrode N2, so as to provide a charging protection function.

It should be noted that, in the serial charging architecture provided in this embodiment, there is only one charging current transmission path (extending from the second battery connecting terminal 224 to the third battery connecting terminal 226) between the first battery BAT1 and the second battery BAT2. Therefore, only one high-current copper foil needs to be arranged between the first battery BAT1 and the second battery BAT2 to transmit the charging current. This avoids the heat dissipation problem of the charging system due to high-current copper foils stacked on the flexible printed circuit board 120.

Figure 3:
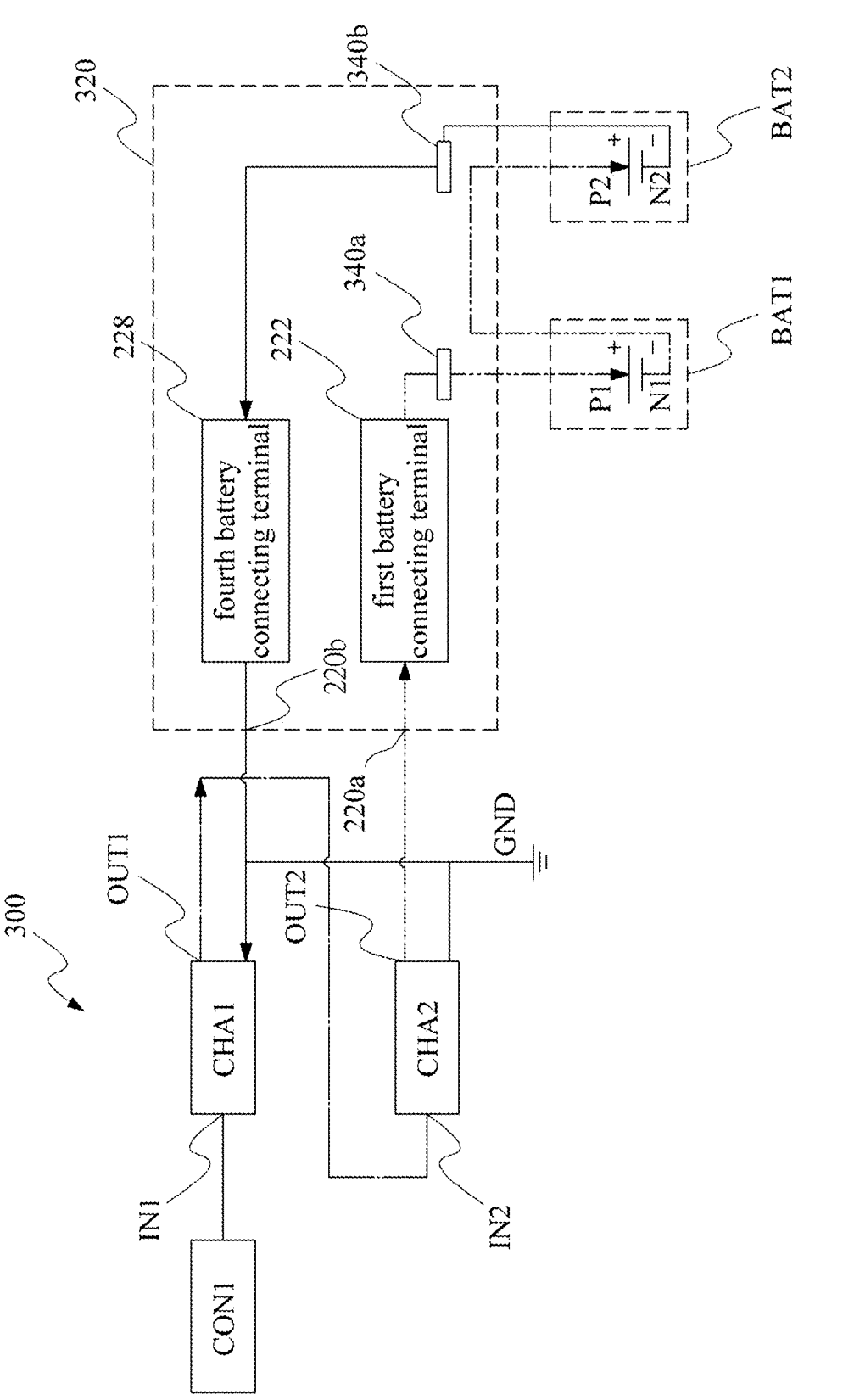
FIG. 3 is a schematic block diagram of another embodiment of a charging system for a mobile device according to the disclosure.

FIG. 3 is a schematic block diagram of another embodiment of a charging system 300 for a mobile device according to the disclosure.

Compared with the charging system 200 in the embodiment of FIG. 2, the charging system 300 for a mobile device in this embodiment further includes a first charging protection unit 340a and a second charging protection unit 340b to provide the charging protection function. The first charging protection unit 340a and the second charging protection unit 340b are disposed on a flexible printed circuit board 320. The first charging protection unit 340a is disposed on a circuit between the first charging connecting terminal 220a and the first battery connecting terminal 222, and the second charging protection unit 340b is disposed on a circuit between the second charging connecting terminal 220b and the fourth battery connecting terminal 228.

The first charging protection unit 340a is a circuit or a charging chip, and the second charging protection unit 340b is a circuit or a charging chip.

In the two embodiments above, two charging components (the first charging component CHA1 and the second charging component CHA2) are used to charge two batteries (the first battery BAT1 and the second battery BAT2) connected in series. However, the disclosure is not limited thereto. According to actual requirements, there are two or more charging components and two or more batteries.

Figure 4:
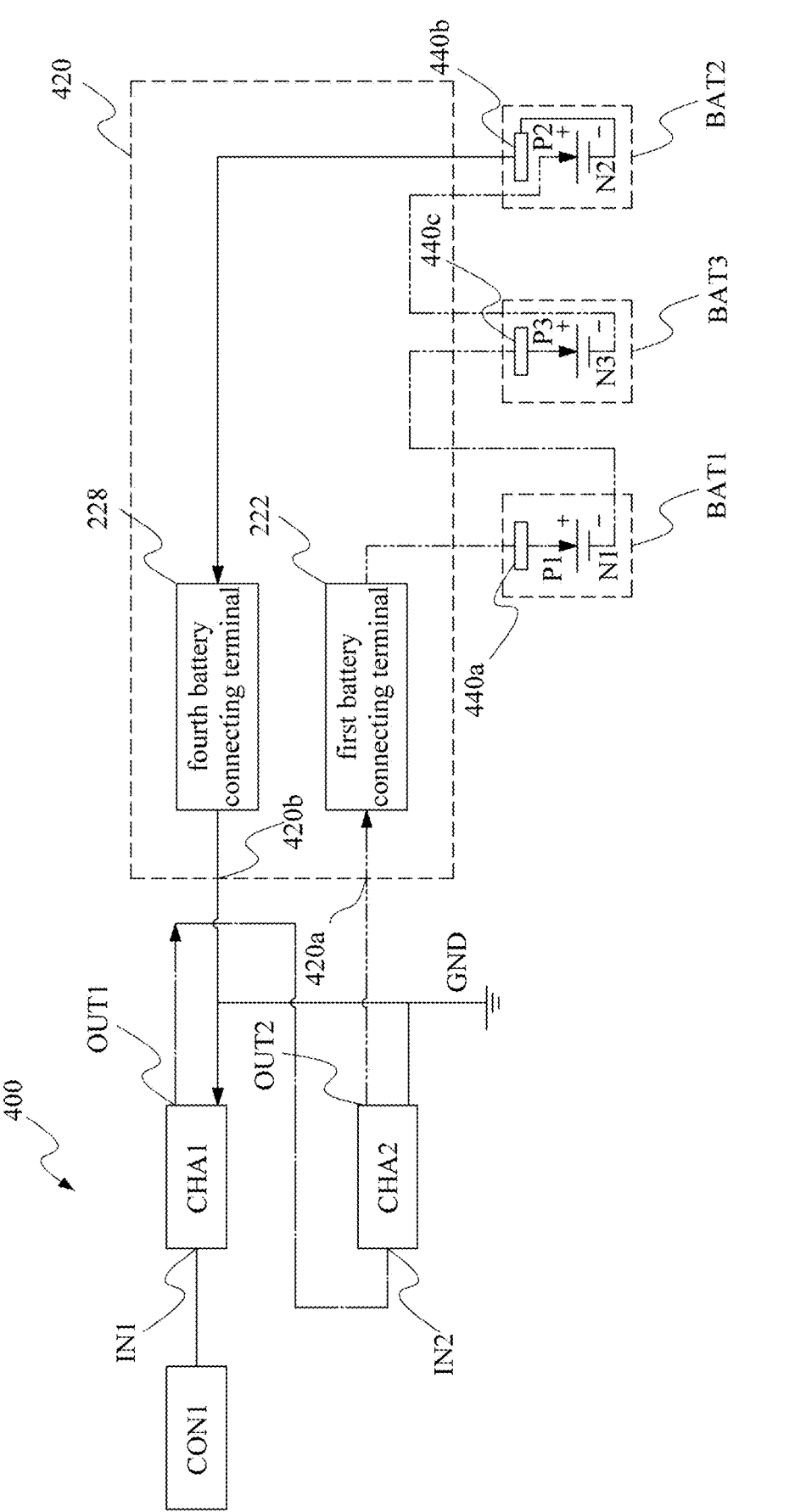
FIG. 4 is a schematic block diagram of another embodiment of a charging system for a mobile device according to the disclosure.

In an embodiment, FIG. 4 is a schematic block diagram of another embodiment of a charging system 400 for a mobile device according to the disclosure.

Compare with the embodiment in FIG. 2, a charging system 400 for a mobile device of this embodiment further includes a third battery BAT3. The third battery BAT3 includes a third positive electrode P3 and a third negative electrode N3. The third positive electrode P3 is electrically connected to the first negative electrode N1 of the first battery BAT1 through a flexible printed circuit board 420, and the third negative electrode N3 is electrically connected to the second positive electrode P2 of the second battery BAT2 through the flexible printed circuit board 420, so that the first battery BAT1, the second battery BAT2 and the third battery BAT3 are electrically connected in series between the first charging connecting terminal 420a and the second charging connecting terminal 420b through the flexible printed circuit board 420. In this way, the first charging component CHA1 and the second charging component CHA2 charge the three batteries simultaneously.

In addition, a first charging protection unit 440a is disposed in the first battery BAT1, a second charging protection unit 440b is disposed in the second battery BAT2, and a third charging protection unit 440c is disposed in the third battery BAT3 to provide a charging protection function.

Similarly, in other embodiments, a third charging component is connected in series between the first output terminal OUT1 of the first charging component CHA1 and the second input terminal IN2 of the second charging component CHA2 (that is, the first output terminal OUT1 of the first charging component is electrically connected to an input terminal of the third charging component, and an output terminal of the third charging component is electrically connected to the second input terminal IN2 of the second charging component CHA2) to increase the charging capacity of the charging system.

Through the charging system 200, 300, 400 for a mobile device provided in the disclosure, there is only one charging current transmission path between the batteries, thereby avoiding the heat dissipation problem of a conventional charging system for a mobile device caused by a plurality of high-current copper foils stacked on a flexible printed circuit board for transmission of the charging current.

The above is merely exemplary embodiments of the disclosure, and does not constitute any limitation on the disclosure. Any form of equivalent replacements or modifications to the technical means and technical content disclosed in the disclosure made by a person skilled in the art without departing from the scope of the technical means of the disclosure still fall within the content of the technical means of the disclosure and the protection scope of the disclosure.

What is claimed is:

1. A charging system for a mobile device, comprising:
a charging connector;
a first charging component, comprising a first input terminal and a first output terminal, wherein the first input terminal is electrically connected to the charging connector;
a second charging component, comprising a second input terminal and a second output terminal, wherein the second input terminal is electrically connected to the first output terminal;
a flexible printed circuit board, comprising:
a first charging connecting terminal, electrically connected to the second output terminal; and
a second charging connecting terminal, electrically connected to a ground terminal;
a first battery, electrically connected to the flexible printed circuit board; and a
second battery, electrically connected to the flexible printed circuit board;
wherein the flexible printed circuit board is used to connect the first battery and the second battery in series between the first charging connecting terminal and the second charging connecting terminal.

2. The charging system for a mobile device according to claim 1, wherein the first charging component is a charging chip.

3. The charging system for a mobile device according to claim 1, wherein the second charging component is a charging chip.

4. The charging system for a mobile device according to claim 1, wherein the flexible printed circuit board comprises a first battery connecting terminal, a second battery connecting terminal, a third battery connecting terminal and a fourth battery connecting terminal; the first battery comprises a first positive electrode and a first negative electrode; the second battery comprises a second positive electrode and a second negative electrode; the first battery connecting terminal and the second battery connecting terminal are electrically connected to the first positive electrode and the first negative electrode, respectively; the third battery connecting terminal and the fourth battery connecting terminal are electrically connected to the second positive electrode and the second negative electrode, respectively; the first battery connecting terminal is electrically connected to the first charging connecting terminal; the second battery connecting terminal is electrically connected to the third battery connecting terminal; and the fourth battery connecting terminal is electrically connected to the second charging connecting terminal.

5. The charging system for a mobile device according to claim 4, further comprising a first charging protection unit, wherein the first charging protection unit is disposed on a circuit between the first charging connecting terminal and the first battery connecting terminal.

6. The charging system for a mobile device according to claim 5, wherein the first charging protection unit is disposed on the flexible printed circuit board.

7. The charging system for a mobile device according to claim 4, further comprising a second charging protection unit, wherein the second charging protection unit is disposed on a circuit between the second charging connecting terminal and the fourth battery connecting terminal.

8. The charging system for a mobile device according to claim 7, wherein the second charging protection unit is disposed on the flexible printed circuit board.

9. The charging system for a mobile device according to claim 1, wherein the first charging component is different from the second charging component.

10. The charging system for a mobile device according to claim 1, wherein the charging connector is a Universal Serial Bus (USB) connector.

11. The charging system for a mobile device according to claim 1, wherein the first charging component is a buck converter.

12. The charging system for a mobile device according to claim 1, further comprising a third battery, wherein the first battery, the second battery, and the third battery are connected in series between the first battery connecting terminal and the second battery connecting terminal.

* * * * *